United States Patent
Reisinger et al.

(10) Patent No.: US 8,520,357 B2
(45) Date of Patent: Aug. 27, 2013

(54) ELECTROSTATIC SHIELD FOR AN HVDC TRANSMISSION COMPONENT

(75) Inventors: Helmut Reisinger, Schwertberg (AT); Hermann Tuma, Aschach (AT)

(73) Assignee: Trench Austria GmbH, Leonding (AT)

( * ) Notice: Subject to any disclaimer, the term of this patent is extended or adjusted under 35 U.S.C. 154(b) by 537 days.

(21) Appl. No.: 12/937,869

(22) PCT Filed: Jan. 30, 2009

(86) PCT No.: PCT/AT2009/000032
§ 371 (c)(1),
(2), (4) Date: Oct. 14, 2010

(87) PCT Pub. No.: WO2009/126977
PCT Pub. Date: Oct. 22, 2009

(65) Prior Publication Data
US 2011/0043320 A1    Feb. 24, 2011

(30) Foreign Application Priority Data
Apr. 18, 2008   (AT) .................................. A 622/2008

(51) Int. Cl.
*H02H 1/04*   (2006.01)
(52) U.S. Cl.
USPC ........................................................ 361/212
(58) Field of Classification Search
USPC ........................................................ 361/212
See application file for complete search history.

(56) References Cited

U.S. PATENT DOCUMENTS

| 4,639,282 A | 1/1987 | Moritz |
| 4,688,142 A | 8/1987 | Hjortsberg et al. |
| 7,646,281 B2 * | 1/2010 | Diekmann et al. ............ 336/234 |

FOREIGN PATENT DOCUMENTS

| CA | 1114465 | 12/1981 |
| DE | 3634946 A1 | 4/1987 |
| JP | 09231839 | 9/1997 |
| WO | WO 2009026960 | 3/2009 |

OTHER PUBLICATIONS

International Search Report from International Application No. PCT/AT2009/000032, issued Jun. 18, 2009.
International Preliminary Report on Patentability issued Nov. 9, 2010 from related International Patent Application No. PCT/AT2009/000032.

* cited by examiner

*Primary Examiner* — Rexford Barnie
*Assistant Examiner* — Tien Mai
(74) *Attorney, Agent, or Firm* — Hoffmann & Baron, LLP

(57) ABSTRACT

An electrostatic shield for an HVDC transmission component, the terminals of which lie at high potential relative to earth during operation, in particular for an HVDC transmission air-core coil, is distinguished by a sheathing, which is provided on at least one end with a collector electrode running substantially over its periphery for connection to one of the terminals of the HVDC transmission component, wherein the sheathing is made from a film composed of electrostatically dissipative material with a surface resistivity in the range of $10^9$ to $10^{14}$ ohm/square.

16 Claims, 3 Drawing Sheets

ELECTROSTATIC SHIELD FOR AN HVDC TRANSMISSION COMPONENT

CROSS-REFERENCE TO RELATED APPLICATIONS

This application is a National Phase application of International Application No. PCT/AT2009/000032 filed Jan. 30, 2009 which claims priority to Austrian Patent Application No. A 622/2008, filed Apr. 18, 2008.

BACKGROUND

The present invention relates to an electrostatic shield for an HVDC transmission component with at least two terminals, in particular for an HVDC transmission air-core coil.

Components for high-voltage d.c. (HVDC) transmission systems lie at high potential relative to earth, e.g. 500 to 800 kV, during operation and are thus exposed to continuous contamination and in some instances with heavy accumulations at some points, which is known as "electrostatic precipitation" or the "black spot" phenomenon. The reason for this is charge carriers that are constantly present in the atmosphere such as ions, ionisable or polarizable dust and dirt particles etc., which in the strong electrostatic field move between the component and its surrounding area to the surface of the component and are deposited there. The extent of electrostatic contamination is last but not least dependent on the amount of free charge carriers available in the surrounding area of the component, e.g. as they become detached from fences, supports in the vicinity etc. and migrate to the surface of the component. This not only generates the mentioned contamination, but also means charge build-up on the outer insulation of the component, which can lead to local discharges.

Various solutions for keeping electrostatic contamination away from HVDC transmission installations or at least reduce it have already been proposed. The use of a Faraday cage around the component or reinforcement of the outer insulation to prevent at least point-type discharges are mentioned as examples. However, these measures are relatively complex and costly to justify their use in practice, and therefore black spot phenomena have simply been accepted hitherto.

SUMMARY

The aim set by the invention is to provide a novel electrostatic shield for HVDC transmission components which overcomes the problem of electrostatic contamination and prevents the formation of black spots in an inexpensive but effective manner. This aim is achieved with an electrostatic shield of the aforementioned type, which is distinguished by a sheathing, which is provided on at least one end with a collector electrode running substantially over its periphery for connection to one of the terminals of the HVDC transmission component, wherein the sheathing is made from a film composed of electrostatically dissipative material with a surface resistivity in the range of $10^9$ to $10^{14}$ ohm/square.

In this way, an electrostatic shield is provided, which as a result of the dissipative effect of its sheathing material can remove charge carriers from the surface of the component and thus prevent an electrostatic charging of the component with the outlined negative consequences, while at the same time providing a sufficiently high electrical resistance to be able to resist the potential difference between the terminals of the component. The charge carriers intercepted by the sheathing are directed to the collector electrode and thus to one of the terminals of the component. Because of the circumferential arrangement of the collector electrodes, the charge carriers can take the shortest route to the collector electrode, which ensures rapid charge decay. The manufacture of the sheathing from a film assures a substantially uniform layer thickness of the dissipative material around the component and a simple application of the sheathing.

According to a preferred embodiment of the invention, the film can be glued onto the component, which enables secure anchorage and additionally also a simple retrofit for existing components.

It is particularly advantageous if the film is joined together in partially overlapping sheets to form the sheathing. As a result of this, webs of film of standardised width can be used for a wide variety of component dimensions. At the same time, an excellent electric contact between adjacent sheets can be achieved.

A particularly advantageous embodiment of the invention is distinguished by the feature that the material of the sheathing is a plastic containing an intrinsically dissipative polymer (IDP). Such polymers were developed as additives for the production of electrostatically conductive plastics, such as used, for example, for packaging organic inflammable granular materials, for handling combustible or explosive materials, for packaging electrostatically sensitive electronic components etc. In the plastic processing operation IDP additives allow an exact adjustment of the conductivity of the plastic end product as a function of its admixture proportion and thus reliable compliance with the abovementioned requirements for charge decay capacity and electric strength.

The surface resistivity preferably lies in the range of $10^{10}$ to $10^{12}$ ohm/square, which provides an excellent compromise between charge removal, on the one hand, and electric strength between the terminals, on the other.

A further preferred embodiment of the invention is distinguished in that the sheathing is provided at both its ends with a respective collector electrode for connection to one of the respective terminals of the component. As a result, the average distances for removal of the charge carriers can be significantly reduced and the discharge time of the shield greatly decreased.

According to a further preferred embodiment of the shield, which is intended for a cylindrical component, the sheathing is also cylindrical and the collector electrode(s) is/are ring-shaped, as a result of which a close match can be obtained.

Aluminium strips, copper strand fabric etc. can be used, for example, for the collector electrode. It is particularly advantageous if the collector electrode(s) is/are made from a carbon fibre band, which combines mechanical strength with good conductivity.

It is particularly favourable in both cases if the film is attached over the collector electrode(s) and in contact therewith, which results in a weather-resistant construction.

The weather-resistance and ageing stability can be increased still further if according to a further preferred feature of the invention the material of the sheathing also contains a UV stabiliser.

The electrostatic shield of the invention is suitable for all kinds of HVDC transmission components, which lie at high potential. A particularly preferred application is an HVDC transmission air-core coil, which comprises at least one concentric winding layer, its terminals lying at its ends, which is fitted with a shield according to the invention such that the sheathing of the shield is attached to the outermost winding layer and the collector electrode(s) of the sheathing is/are respectively connected to a terminal. As a result, during operation an electrostatic contamination of the coil is avoided, the formation of black spots and point discharges prevented and the coil is resistant to ageing and weather-resistant.

According to a preferred variant of the HVDC transmission air-core coil, the sheathing of the shield can also be attached to a rigid support bush, which is spaced from the outermost winding layer by means of spacers, as a result of which an additional cooling air gap is obtained between the outermost winding layer and the shield. As a result, the shield can be prevented from heating up during operation, which improves the resistance to ageing still further.

BRIEF DESCRIPTION OF THE DRAWINGS

The invention is explained in more detail below on the basis of an exemplary embodiment shown in the attached drawings.

DETAILED DESCRIPTION

Figure 1:
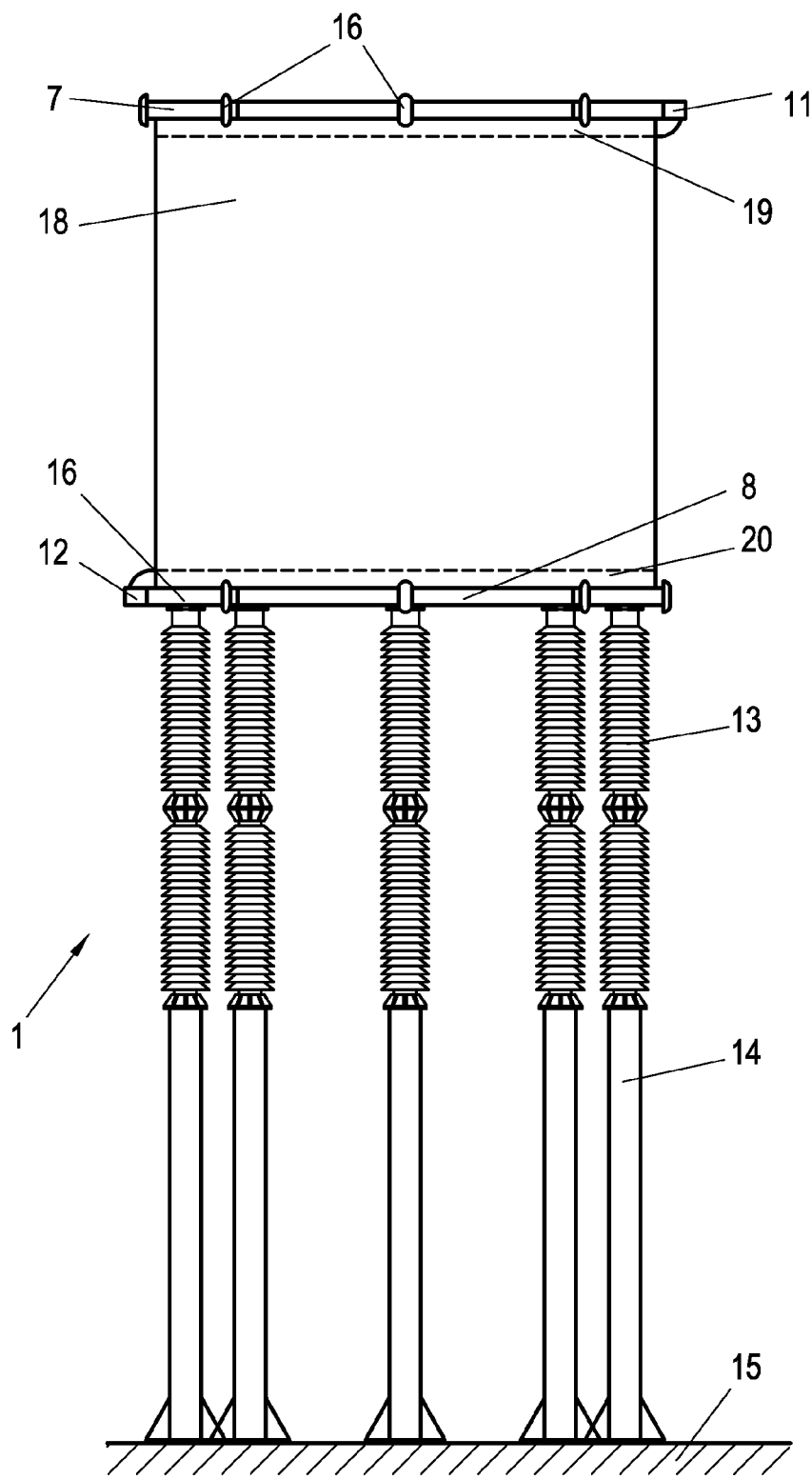
FIGS. 1 and 2 show the HVDC transmission air-core coil of the invention in side view and plan view.
Figure 2:
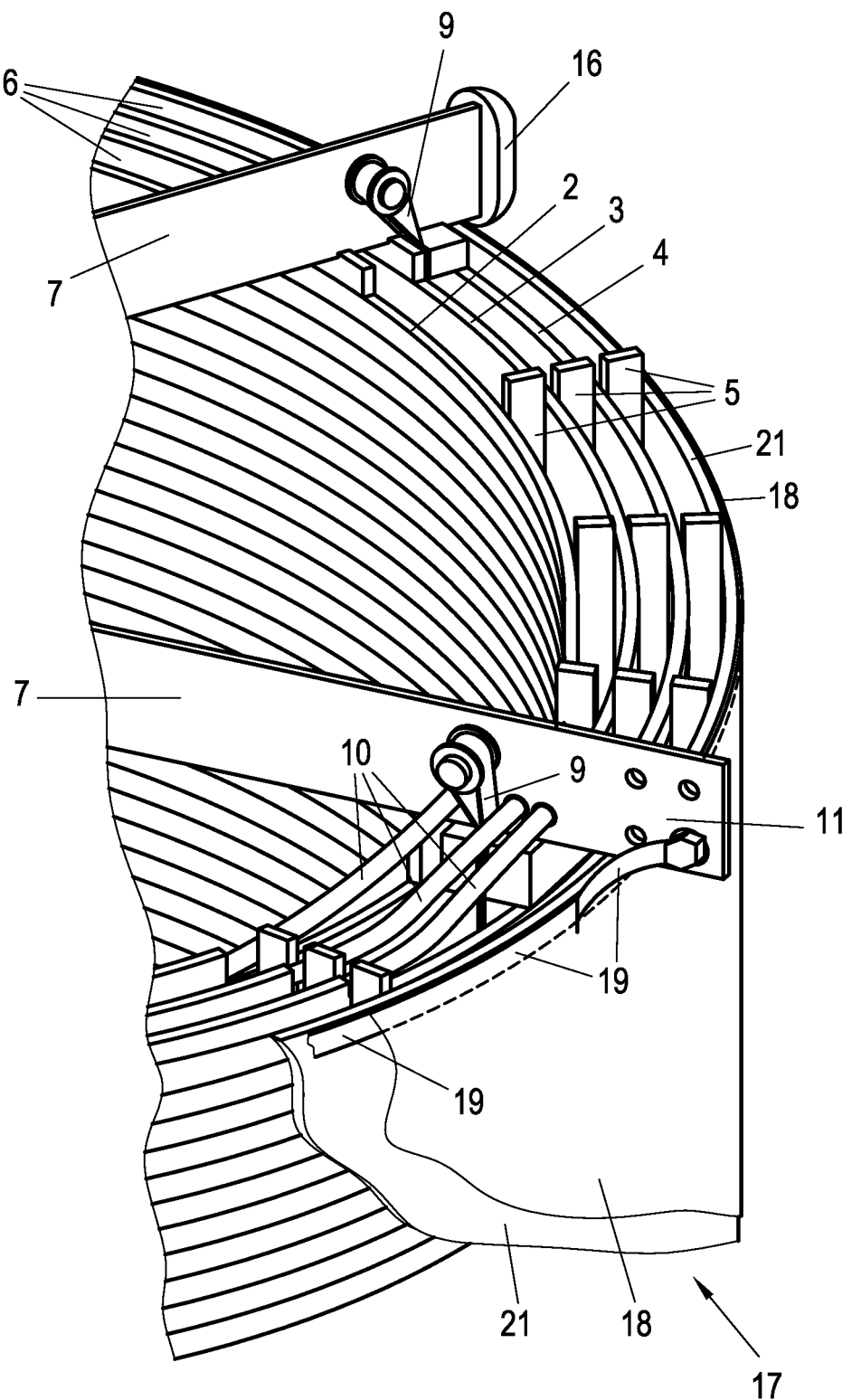

FIGS. 1 and 2 show an HVDC transmission air-core coil 1, such as used, for example, in high-voltage direct current (HVDC) transmission links as smoothing choke.

In contrast to oil-insulated coils, air-core coils are "dry-insulated" choke coils, in which the ambient air forms the outer insulation of the choke coil and also which generally do not contain a ferromagnetic core.

In the shown example, the air-core coil 1 comprises three concentric winding layers 2, 3, 4 connected electrically in parallel, which are spaced from one another by spacers 5 to form cooling air gaps 6 between them.

The winding layers 2-4 are held together at the upper and lower ends by multi-arm star-type holders 7, 8, which are clamped against one another by means of strap retainers 9. The conductors 10 of the winding layers 2-4 are electrically connected to the star-type holders 7, 8 and the latter have terminal lugs, which form the terminals 11, 12 of the air-core coil 1.

The air-core coil 1 is supported in vertically upright position by means of insulators 13 and steel girders 14 to earth. During operation the air-core coil 1 lies at high electrical potential relative to earth, e.g. 500 to 800 kV, and carries a current of up to 4000 A. The voltage drop over the air-core coil 1, i.e. between its terminals 11, 12, is small in comparison thereto and corresponds to about the residual ripple of the voltage to be smoothed, generally some 100s of volts to a few kilovolts. A significant voltage, which the insulation of the windings between the star-type holders 7, 8 must withstand, can only drop at the air-core coil 1 in the case of transient events, such as switching processes or lightning strikes. Cap shields 16 prevent excessive local electrical field intensities on pointed parts such as the ends of the star-type holders 7, 8.

Figure 3:
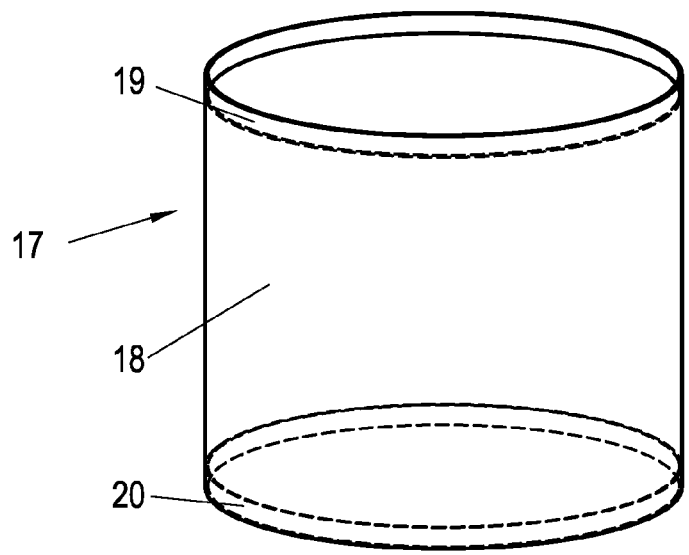
FIG. 3 is a perspective view of the shield of the HVDC transmission air-core coil of FIG. 1 and FIG. 2.

Because of the high potential of the air-core coil 1, a strong electrostatic field develops between the outer surface of the air-core coil 1 and earth 15, which can lead to charge carriers from the surrounding area being deposited on the outermost winding layer 4 with the abovementioned consequences of electrostatic contamination or the formation of black spots. To prevent these, the air-core coil 1 is provided with an electrostatic shield 17, which will now be explained in more detail on the basis of FIGS. 2 to 4.

The electrostatic shield 17 of the HVDC transmission air-core coil 1 comprises a mantle or sheathing 18 made from electrostatically dissipative material with a surface resistivity in the range of $10^9$ to $10^{14}$ ohm/square. The sheathing 18 is respectively electrically connected at its upper and lower ends to a collector electrode 19, 20, which runs over a large portion of its periphery (circumference), preferably over its entire periphery, and is respectively connected to the upper or lower terminal 11, 12 of the air-core coil 1.

The shield 17 can be attached directly to the outer surface of the air-core coil 1, i.e. the sheathing 18 directly onto the outer surface of the outermost winding layer 4. In the embodiment shown in FIG. 2, a rigid support bush 21 is additionally optionally used, which is spaced from the outermost winding layer 4 by means of spacers 5 and to which the sheathing 18 is attached. As a result of this, a further air gap 6 is provided between the outermost winding layer 4 and the shield 17, which serves to cool the shield 17.

Because of the dissipative effect of the material of the sheathing 18, the charge carriers striking against the shield 17 are respectively discharged on the shortest path to the closest collector electrode 19, 20 and thus to one of the terminals 11, 12. A charge build-up on the outer surface of the air-core coil 1 with the consequences outlined above is thus avoided.

The dissipative material of the sheathing 18 is preferably a plastic, which contains an additive of the intrinsically dissipative polymer (IDP) type. Such IDP additives are embedded into the polymer matrix of the plastic during processing of the plastic, e.g. by inclusion as granulate during the fusion casting process, and form a conductive fibre network in the plastic, by means of which electrostatic charges are quickly discharged (dissipated). IDP additives allow a precisely reproducible adjustment of the conductivity of the end product in dependence on its admixture ratio.

For the purpose of the present invention, IDPs are added to the base plastic material of the sheathing 18 in such a proportion that the surface resistivity of the finished sheathing 18 lies in the range of $10^9$ to $10^{14}$ ohm/square, particularly preferred in the range of $10^{10}$ to $10^{12}$ ohm/square. Charge decay times of less than 0.02 seconds can be achieved as a result of this.

Exemplary plastic materials for the sheathing 18, which can be added to IDPs, include—but are not limited to—polypropylene (PP), polyethylene (PE), polyvinyl chloride (PVC), acrylonitrile butadiene styrene (ABS) and similar. Exemplary IDP additives for adding to the plastic material are available from Ciba Speciality Chemicals under the trade mark IRGASTAT®.

The IDPs can be added to the plastic material in granular form, for example, during blow moulding of the plastic material to form a film for the sheathing 18. A UV stabiliser can also be added to increase the UV resistance of the sheathing 18.

Figure 4:
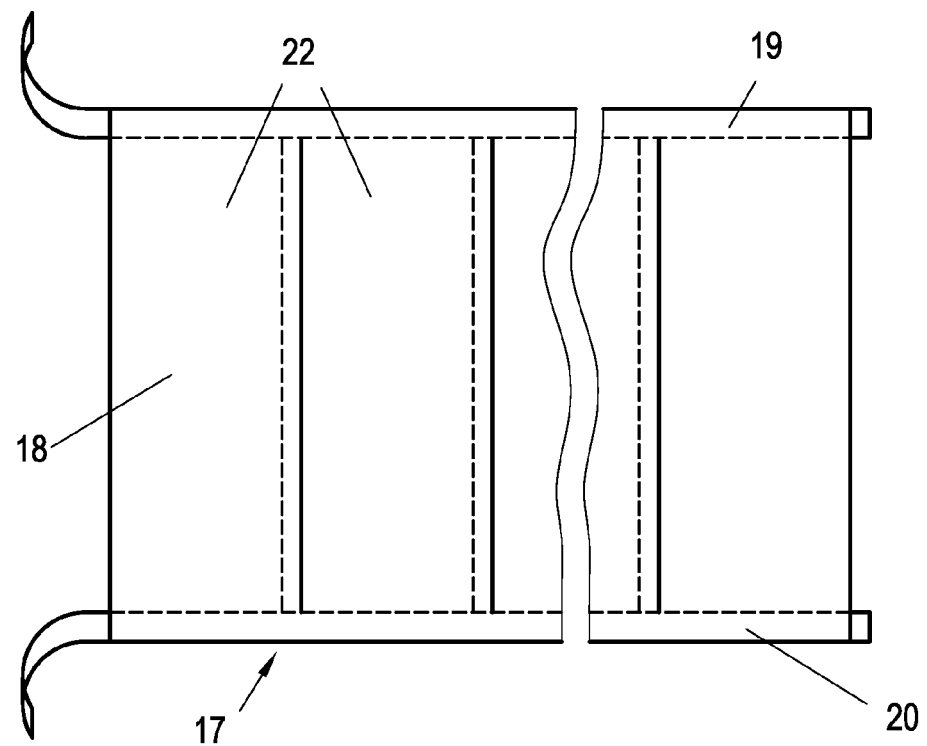
FIG. 4 shows the shield of FIG. 3 in a developed view.

As shown in the developed view in FIG. 4, the sheathing 18 is composed from webs or sheets of a film 22 with a width of about 50 cm, wherein the sheets are joined to form the cylindrical sheathing 18 by overlapping one another to approximately 15 to 40 mm. The film 22 can be self-adhesive, and the film sheets can be glued to the outer surface of the air-core coil 1 or the outer surface of the support bush 21.

The ring-shaped collector electrodes 19, 20 can be made from any desired conductive material, e.g. from copper strands, aluminium strips or preferably from carbon fibre bands. During production of the shield 17 the collector electrodes 19, 20 are preferably firstly attached to the outer surface of the outermost winding layer 4 or the support bush 21 and connected to the terminals 11, 12, and then the sheathing 18 is applied thereover in a second step, e.g. by gluing the film 22 thereon. As a result, the sheathing 18 is in direct contact with the collector electrodes 19, 20.

It is not absolutely essential to provide two collector electrodes 19, 20, e.g. one on each terminal 11, 12, for basic functionality of the shield 17. In the simplest case, a single collector electrode on the upper or lower end of the sheathing 18 is sufficient. However, the use of two collector electrodes 19, 20 opposite one another decreases the distance for discharging the charge carriers from the sheathing 18 and thus the charge decay time of the shield 17.

The shield according to the invention is suitable for the antistatic fitting of any desired HVDC transmission components that are located at a high potential relative to earth, e.g. also for shielding components in gas-insulated systems (GIS) and generally for any desired HVDC transmission installations.

On this basis, the invention is not restricted to the illustrated embodiments, but covers all variants and modifications that fall within the framework of the attached claims.

The invention claimed is:

1. An electrostatic shield for an HVDC transmission component with at least two terminals comprising:
    a sheathing provided on at least one end with a collector electrode running substantially along a periphery of the sheathing for connection to one of the terminals of the HVDC transmission component, and
    wherein the sheathing is made from a film of electrostatically dissipative material with a surface resistivity in the range of $10^9$ to $10^{14}$ ohm/square.

2. The shield according to claim 1, wherein the film is glued onto the HVDC transmission component.

3. The shield according to claim 1, wherein the film comprises a plurality of overlapping sheets jointed together to form the sheathing.

4. The shield according to claim 1, wherein said electrostatically dissipative material is a plastic containing an intrinsically dissipative polymer (IDP).

5. The shield according to claim 1, wherein said surface resistivity lies in the range of $10^{10}$ to $10^{12}$ ohm/square.

6. The shield according to claim 1, wherein the sheathing includes two ends and each end is provided with a respective collector electrode for connection to one of the respective terminals of the component.

7. The shield according to claim 1, wherein the sheathing is cylindrical and the collector electrode is ring-shaped.

8. The shield according to claim 1, wherein the collector electrode is made from a carbon fiber band.

9. The shield according to claim 1, wherein the film is attached over the collector electrode and in contact therewith.

10. The shield according to claim 1, wherein said electrostatically dissipative material additionally contains a UV stabilizer.

11. An HVDC transmission air-core coil, which comprises at least one concentric winding layer having first and second ends, each of the first and second ends of the winding layer including a terminal, and an electrostatic shield according to claim 1, wherein the sheathing is attached to an outermost winding layer and the collector electrode is connected to one of the terminals.

12. An HVDC transmission air-core coil, which comprises at least one concentric winding layer, having first and second ends, each of the first and second ends of the winding layer including a terminal, and an electrostatic shield according to claim 1, wherein the sheathing is attached to a rigid support bush spaced from the outermost winding layer by means of spacers, and the collector electrode is connected to one of the terminals.

13. An electrostatic shield for an HVDC transmission component having at least two terminals, comprising:
    a sheathing having a collector electrode provided on at least one end of the sheathing, the sheathing having a periphery, the collector electrode running substantially along the periphery of the sheathing and being connectable to one of the at least two terminals of the HDVC transmission component; and wherein the sheathing is made from a film of electrostatically dissipative material having a surface resistivity in the range of $10^9$ to $10^{14}$ ohm/square.

14. The shield according to claim 13, wherein said electrostatically dissipative material is a plastic containing an intrinsically dissipative polymer (IDP).

15. The shield according to claim 13, wherein said surface resistivity is in the range of $10^{10}$ to $10^{12}$ ohm/square.

16. The shield according to claim 13, wherein the collector electrode is made from a carbon fiber band.

* * * * *